(12) United States Patent
Shinozaki

(10) Patent No.: US 7,052,779 B2
(45) Date of Patent: May 30, 2006

(54) COPPER FOIL FOR FINE PATTERN PRINTED CIRCUITS AND METHOD OF PRODUCTION OF SAME

(75) Inventor: Kensaku Shinozaki, Tochigi (JP)

(73) Assignee: Furukawa Circuit Foil Co., Ltd., Tokyo (JP)

( * ) Notice: Subject to any disclaimer, the term of this patent is extended or adjusted under 35 U.S.C. 154(b) by 96 days.

(21) Appl. No.: 10/774,375

(22) Filed: Feb. 10, 2004

(65) Prior Publication Data
US 2004/0157080 A1    Aug. 12, 2004

(30) Foreign Application Priority Data
Feb. 12, 2003    (JP)    ............... 2003-033160

(51) Int. Cl.
*B32B 15/01*    (2006.01)
*B32B 15/04*    (2006.01)
*B32B 15/20*    (2006.01)

(52) U.S. Cl. ............... 428/607; 428/674; 428/675; 428/687; 428/447

(58) Field of Classification Search ............... 428/687, 428/606, 607, 612, 666, 674, 675, 676, 658, 428/680, 457, 447, 450
See application file for complete search history.

(56) References Cited

U.S. PATENT DOCUMENTS

| | | | |
|---|---|---|---|
| 3,293,109 A | 12/1966 | Luce et al. | ............... 161/166 |
| 5,171,417 A | 12/1992 | DiFranco et al. | |
| 5,431,803 A * | 7/1995 | DiFranco et al. | ............... 205/50 |
| 5,679,230 A | 10/1997 | Fatcheric et al. | ............... 205/50 |
| 5,834,140 A | 11/1998 | Wolski et al. | |
| 5,863,410 A | 1/1999 | Yates et al. | ............... 205/585 |
| 6,270,645 B1 | 8/2001 | Yates et al. | ............... 205/77 |
| 2002/0011418 A1 | 1/2002 | Manabe et al. | ............... 205/191 |
| 2004/0043242 A1 * | 3/2004 | Nakaoka et al. | ............... 428/553 |

FOREIGN PATENT DOCUMENTS

| | | |
|---|---|---|
| EP | 0 557 073 | 8/1993 |
| EP | 0 709 494 | 5/1996 |
| JP | 40-15327 | 7/1965 |
| JP | 06-270331 | 9/1994 |
| JP | 09-143785 | 6/1997 |
| JP | 11-256389 | * 9/1999 |

* cited by examiner

OTHER PUBLICATIONS

European Search Report mailed May 19, 2004 for corresponding foreign application No. 04250762.

*Primary Examiner*—Michael E. Lavilla
(74) *Attorney, Agent, or Firm*—Westerman, Hattori, Daniels & Adrian, LLP

(57) ABSTRACT

Copper foil for fine pattern printed circuits having a sufficient bond strength with a resin substrate, eliminating the problems of residual copper, erosion at the bottom portions of the circuit lines, etc. at the time of formation of fine patterns, and superior in heat resistance and electrical characteristics, comprising untreated copper foil roughening treated on its surface, wherein the untreated copper foil before roughening treatment is an electrodeposited copper foil having a surface roughness in terms of 10-point average roughness Rz not more than 2.5 μm and a minimum distance between peaks of rough pyramid of at least 5 μm or having further crystal grains of an average particle size of not more than 2 μm exposed at the surface thereof, and a method of production of the same.

8 Claims, 4 Drawing Sheets

10 : UNTREATED COPPER FOIL
12 : FINE ROUGHENING PARTICLE LAYER
12a : FINE ROUGHENING PARTICLE
12b : ABNORMAL DEPOSION OF FINE ROUGHENING PARTICLE

10 : UNTREATED COPPER FOIL
12 : FINE ROUGHENING PARTICLE LAYER
12a : FINE ROUGHENING PARTICLE
12b : ABNORMAL DEPOSION OF
 FINE ROUGHENING PARTICLE

11 : UNTREATED COPPER FOIL
12 : FINE ROUGHENING PARTICLE LAYER
12a : FINE ROUGHENING PARTICLE
12b : ABNORMAL DEPOSITION OF
 FINE ROUGHENING PARTICLE

9 : UNTREATED COPPER FOIL
12 : FINE ROUGHENING PARTICLE LAYER
12a : FINE ROUGHENING PARTICLE

8 : FINE PATTERN

COPPER FOIL FOR FINE PATTERN PRINTED CIRCUITS AND METHOD OF PRODUCTION OF SAME

BACKGROUND OF THE INVENTION

1. Field of the Invention

The present invention relates to copper foil for fine pattern printed circuits and a method for production of the same.

2. Description of the Related Art

Normally, electrodeposited copper foil is produced by two processes. The first process is for making the foil by an electrodeposited foil-making system. The second process is for roughening treating the surface to improve the bondability and performing various other surface treatment by a surface treatment system so as to produce the type of copper foil suitable for a printed circuit board. FIG. 1 shows the first process in the production of electrodeposited copper foil. The electrodeposited foil-making system is comprised of a rotating drum-like cathode (made of stainless steel or titanium) 2 and an anode (made of Pb or DSA) 1 arranged concentrically and cylindrically with respect to the cathode 2. A copper plating solution 3 is passed between the cathode 2 and the anode 1 and a current is passed across the electrodes so as to cause copper to deposit to a predetermined thickness on the cathode 2. This is then peeled off to obtain a copper foil 4. This copper foil 4 will be called the "untreated copper foil" in this specification. The untreated copper foil is then given the properties required for a copper-clad laminate by the second process where, as shown in FIG. 2, it is continuously treated on its surface electrochemically or chemically. FIG. 2 shows a surface treatment system for treating the surface of the untreated copper foil. This passes the untreated copper foil 4 continuously through an electroplating tank filled with an electrolytic solution 5 and an electroplating tank filled with an electrolytic solution 6 and treats its surface using the electrodes 7 as the anode and the copper foil itself as the cathode and thereby produces surface-treated copper foil 8. The copper foil surface treated in this way will be called the "surface-treated copper foil" in this specification. The surface-treated copper foil is used for a printed circuit board.

The surface treatment method of the untreated copper foil enables the copper foil to be strongly bonded with a resin board or enables the electrical properties, etching properties, heat resistance, or chemical resistance required for a printed circuit board to be satisfied by roughening treating the surface of the copper foil to be bonded with the resin board and by plating the thus roughening treated surface with zinc, nickel, etc. or further treating the zinc, nickel, or otherwise plated surface by chromate, a silane coupling agent, etc. As one example, the method has been disclosed of using the copper foil as a cathode in an acidic copper plating bath and performing so-called "burnt plating" near the limit current density so as to roughen the surface of the copper foil to be bonded (for example, see Japanese Examined Patent Publication (Kokoku) No. 40-15327). Further, the method has been disclosed of roughening treating the surface of copper foil to be bonded and covering the surface of the roughening treated side having a plurality of fine projections with an smooth thin layer of copper plating (so-called "encapsulation layer" so as to stably fix the plurality of fine projections of the roughening treated side to the copper foil (for example, see specification of U.S. Pat. No. 3,293,109). This series of treatments is called "roughening treating" in this specification.

A printed circuit board using such a surface-treated copper foil is usually produced in the following way. First, the surface of an electrically insulating substrate comprised of a glass epoxy resin, a polyimide resin, etc. is covered with the surface-treated copper foil for surface circuit formation, then these are heated and pressed to produce a copper-clad laminate. Next, the copper-clad laminate is formed with through holes and the through holes plated, then the copper foil at the surface of the copper-clad laminate is etched to form circuit patterns having the desired line widths and desired space widths. Finally, the solder resist is formed and other finishing performed. The copper foil used at this time has a rough side as the surface of the side to be hot press bonded to the substrate. This rough side exhibits an anchoring effect to the substrate and thereby improves the bond strength between the substrate and copper foil and ensures reliability of the printed circuit board.

Further, recently, resin-coated copper foil comprised of copper foil with the rough side covered by an adhesive resin such as an epoxy resin in advance and using that adhesive resin as a semicured state (B-stage) insulating resin layer has been used as copper foil for surface circuit formation. The insulating resin layer side has been hot press bonded to the substrate to produce a printed circuit board, in particular a builtup printed circuit board. Further, to deal with the increasing higher integration of various electronic devices, such builtup printed circuit boards have been required to offer higher densities of circuit patterns as well. So-called "fine pattern" printed circuit boards with circuits of fine line widths and space widths have begun to be demanded. For example, in the case of printed circuit boards used for semiconductor packages, printed circuit boards having high density superfine circuits of line widths and space widths of around 15 µm are being demanded.

If using copper foil with a large roughness of the surface as copper foil for forming such a printed circuit board, the time required for etching down to the surface of the substrate will become longer. As a result, as shown in FIG. 3, the perpendicularity of the side walls in the circuit patterns of the copper foil A clad with the substrate B will be ruined and the etching factor (Ef), as expressed by the following formula:

$$Ef=2T/(Wb-Wt)$$

(where, T is the thickness of the copper foil, Wb is the bottom width of the circuit patterns formed, and Wt is the top width of the circuit patterns formed), will become small. This problem does not become that severe when the line widths in the circuit patterns formed is large, but in the case of fine line width circuit patterns, it could lead to missing conductors. To deal with the demands for fine patterns, one of the important factors having a large effect on the etchability in the performance of copper foil is the roughness of the surface. In particular, the roughness of the surface which is roughening treated for bonding with a resin substrate has a large effect. The factors influencing the roughness of copper foil can be largely classified into two. One is the surface roughness of the rough side of the untreated copper foil, while the other is the manner of deposition of the granular metal deposited by the roughening treating (plating). If the surface roughness of the rough side of the untreated copper foil is large, the roughness of the surface of the copper foil after the roughening treating will also become large. Further, if the amount of deposition of the granular metal is large, in general the roughness of the surface of the copper foil after roughening treating will become large. The roughness of the rough side of the untreated copper foil is largely determined by the electrolytic conditions when causing deposition of copper on the drum-like cathode when producing copper foil electrolytically, in particular the additives used in the electrolytic solution. Further, the shapes of the grains and the method of deposition are largely affected by the composition of the copper plating solution and plating conditions of the "burnt plating" forming the roughening treating.

In general, when producing a so-called "shiny side", the surface at the side contacting the drum is relatively smooth, but the opposite side, that is, the surface in contact with the copper plating solution, has rough surfaces. Therefore, as an experiment for smoothing the rough side, for example the method of producing electroplated copper foil by adding thiourea or other active sulfur to the copper plating solution has been disclosed (for example, see specification of U.S. Pat. No. 5,171,417). The rough side of the untreated copper foil produced by this method, however, does indeed have a small Rz value of the rough surfaces (note that the "surface roughness Rz" spoken of here is the 10-point average roughness defined in JIS-B6012, same below), but as shown in FIG. 4, there are parts of peaks and valleys on the surface of the untreated copper foil 4 (hereinafter called "rough pyramid" in this specification). Normally, the distance between peaks of rough pyramid of the copper foil is less than 5 μm. If roughening such a surface, as shown in FIG. 4, roughening particles 12 will deposit concentrated at the portions of the peaks of the rough pyramid and will not deposit much at the portions of the valleys. Further, depending on the composition of the copper plating solution and the plating conditions for the roughening treating, as shown by reference numeral 12b in FIG. 4, abnormal deposition of roughening particles will occur. Such abnormal deposition will result in so-called "residual copper" after producing and etching the copper-clad laminate and make formation of fine patterns impossible.

Further, the shiny side is relatively smooth, so experiments have been made with depositing granular copper on the shiny side to raise the bond strength with a resin substrate (for example, see Japanese Unexamined Patent Publication (Kokai) No. 6-270331). However, the shiny side of the untreated copper foil appears shiny and smooth at first glance, but as explained above, this is the surface in contact with the titanium drum, so becomes an exact replica of the titanium drum. Therefore, it is affected by surface scratches of the titanium drum and deep scratch-like defects sometimes are seen. If roughening treating such a defect surface, as shown in FIG. 5, the Rz value of the relief shapes will indeed be small, but abnormal deposition 12b of roughening particles will occur at the scratch portions, the abnormally deposited portions will turn into residual copper at the time of preparing the fine patterns, and fabrication of fine patterns will become difficult.

With the copper foil and method of treating the rough side according to the technology disclosed in the above prior art, it is not possible to cope with the demands for increasingly fine patterns of recent years when electronic equipment has been made smaller and higher in performance and when printed circuits are being required to be made smaller and higher in density. Problems such as insufficient bonding strength with the resin substrate, residual copper when forming the fine patterns, and erosion at the bottom portions of the circuit lines are being pointed out.

SUMMARY OF THE INVENTION

An object of the present invention is to provide a copper foil for fine pattern printed circuits having sufficient bond strength with a resin substrate, solving the problems of residual copper at the time of formation of the fine patterns and erosion at the bottom portions of the circuit lines, and superior in heat resistance and electrical characteristics and a method of production of the same.

To attain the above object, according to a first aspect of the present invention, there is provided a copper foil for fine pattern printed circuits comprising untreated copper foil roughening treated on its surface, wherein the untreated copper foil before roughening treatment is an electrodeposited copper foil having a surface roughness in terms of 10-point average roughness Rz of not more than 2.5 μm and a minimum distance between peaks of rough pyramid of at least 5 μm.

According to a second aspect of the present invention, there is provided a copper foil for fine pattern printed circuits comprising untreated copper foil roughening treated on its surface, wherein the untreated copper foil before roughening treatment is an electrodeposited copper foil having a surface roughness in terms of 10-point average roughness Rz of not more than 2.5 μm, a minimum distance between peaks of rough pyramid of at least 5 μm, and crystal grains of an average particle size of not more than 2 μm exposed at the surface.

Preferably, at least one surface of the untreated copper foil is roughening treated by being formed with a burnt plating layer by burnt plating of copper containing at least one of molybdenum, iron, cobalt, nickel and tungsten.

More preferably, the burnt plating layer is formed over it with a copper plating layer.

According to a third aspect of the present invention, there is provided a method of production of a copper foil for fine pattern printed circuits comprising roughening treating on the surface of untreated electrodeposited copper foil formed in a copper plating bath into which a compound having mercapto groups, chloride ions, and a low molecular weight glue having a molecular weight of not more than 10,000 and/or a high molecular weight polysaccharide are added at a range of current density of 50 A/dm$^2$ to 100 A/dm$^2$.

According to a fourth aspect of the present invention, there is provided a method of production of a copper foil for fine pattern printed circuits comprising forming a burnt plating layer of copper on at least one surface of an untreated electrodeposited copper foil having a surface roughness in terms of 10-point average roughness Rz of not more than 2.5 μm and a minimum distance between peaks of rough pyramid of at least 5 μm by electroplating in a plating bath containing at least one of 0.001 to 5 g-Mo/l, 0.01 to 10 g-M/l (M=Fe and/or Co and/or Ni) and 0.1 to 1 ppm W while holding a plating solution temperature of 10 to 30° C., using the untreated electrodeposited copper foil as the cathode, and at a current density near the limit current density of the bath.

According to a fifth aspect of the present invention, there is provided a method of production of a copper foil for fine pattern printed circuits comprising forming a burnt plating layer of copper on at least one surface of an untreated electrodeposited copper foil having a surface roughness in terms of 10-point average roughness Rz of not more than 2.5 μm, a minimum distance between peaks of rough pyramid of at least 5 μm, and crystal grains of an average particle size of not more than 2 μm exposed at the surface, by electroplating in a plating bath containing at least one of 0.001 to 5 g-Mo/l, 0.01 to 10 g-M/l (M=Fe and/or Co and/or Ni) and 0.1 to 1 ppm W while holding a plating solution temperature of 10 to 30° C., using the untreated electrodeposited copper foil as the cathode, and at a current density near the limit current density of the bath.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

A preferred embodiment of the present invention will be described in detail below while referring to the attached figures. The present invention however is not limited to this.

Figure 1:
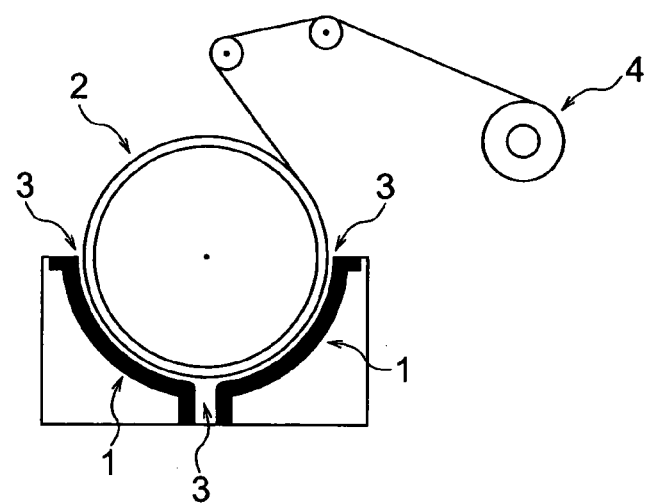
FIG. 1 is an explanatory view of the process of production of an untreated copper foil.
Figure 2:
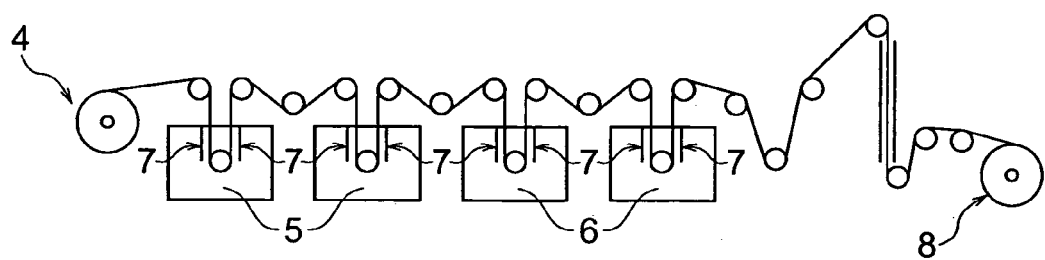
FIG. 2 is an explanatory view of the process of roughening treatment of the untreated copper foil.
Figure 3:
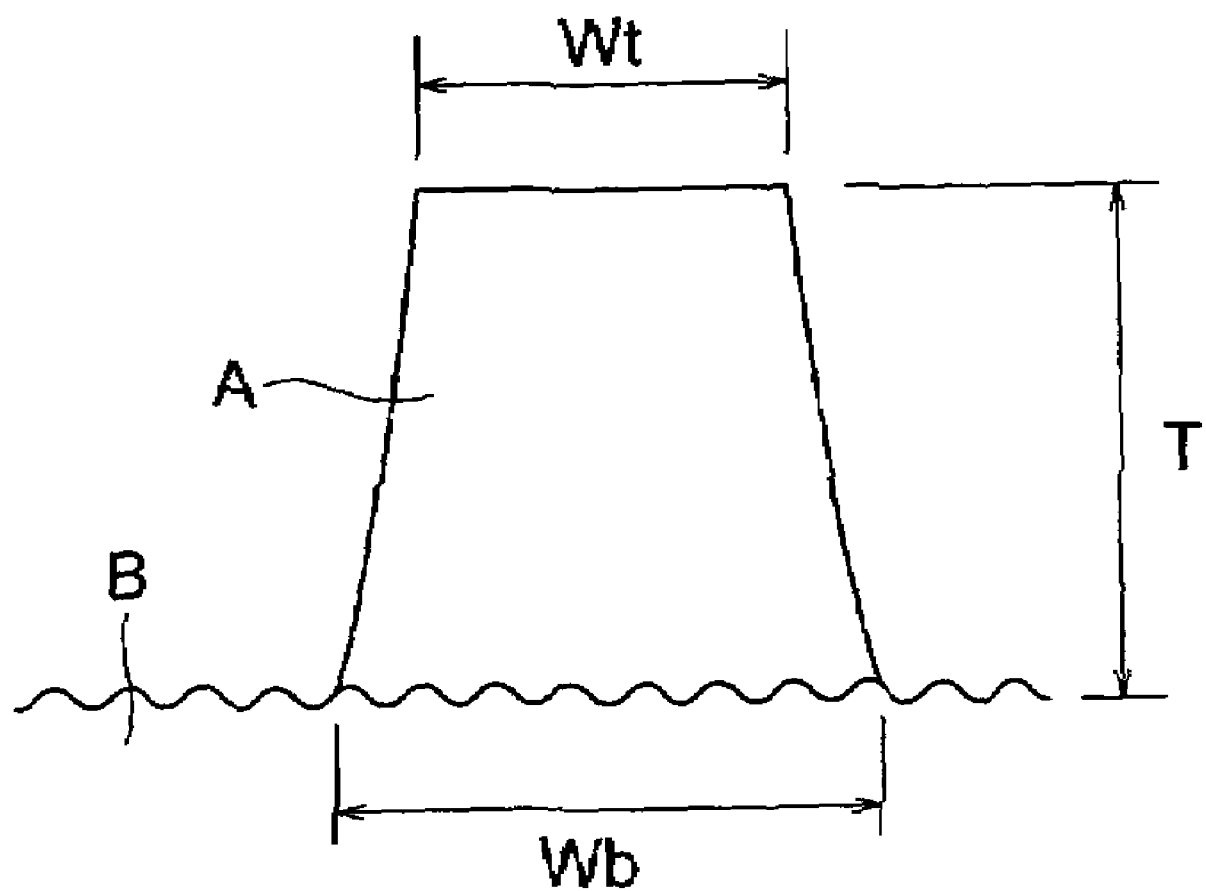
FIG. 3 is an explanatory view of an example of the state when etching a copper foil of a copper foil laminated substrate.
Figure 4:
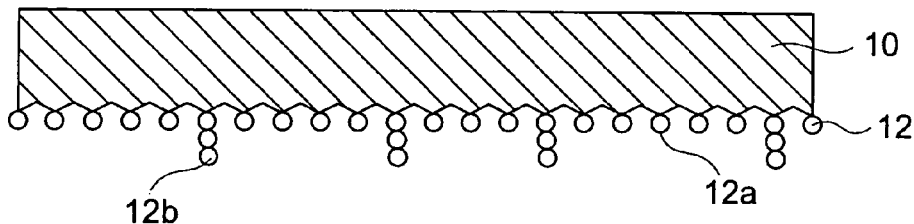
FIG. 4 is an explanatory view of an example of the state of causing roughening particles to deposit on a matt side of conventional untreated copper foil.
Figure 5:
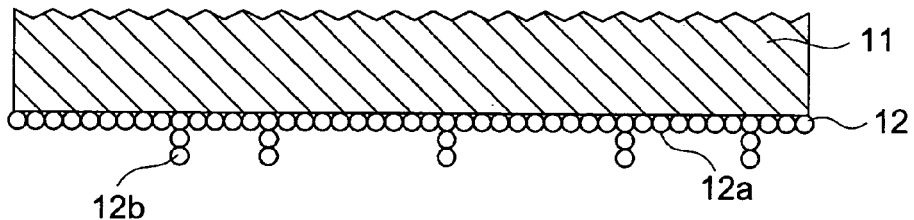
FIG. 5 is an explanatory view of an example of the state of causing roughening particles to deposit on a shiny side of conventional untreated copper foil.
Figure 6:
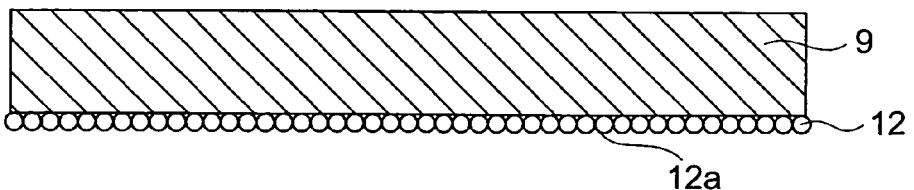
FIG. 6 is an explanatory view of an example of the state of causing roughening particles to deposit on a matte side of untreated copper foil according to the present invention.

FIG. 6 is an explanatory view of an example of the state of causing roughening particles to deposit on a matte side of untreated copper foil according to the present embodiment.

That is, fine roughening particle layer 12 is formed on the surface of the untreated copper foil 9 as roughening treatment by depositing fine roughening particles 12a.

The copper foil for fine pattern printed circuits of this embodiment comprises untreated copper foil roughening treated on its surface, wherein the untreated copper foil before roughening treatment is an electrodeposited foil having a surface roughness in terms of 10-point average roughness Rz, of not more than 2.5 µm and a minimum distance between peaks of rough pyramid of at least 5 µm.

Further, the copper foil for fine pattern printed circuits of this embodiment comprises of untreated copper foil roughening treated on its surface, wherein the untreated copper foil before roughening treatment is an electrodeposited foil having a surface roughness in terms of 10-point average roughness Rz of not more than 2.5 µm, a minimum distance between peaks of rough pyramid of at least 5 µm, and crystal grains of an average particle size of not more than 2 µm exposed at the surface.

One method of production of a copper foil for fine pattern printed circuits of this embodiment comprises roughening treating on the surface of untreated electrodeposited copper foil formed in a copper plating bath into which a compound having mercapto groups, chloride ions, and a low molecular weight glue having a molecular weight of not more than 10,000 and/or a high molecular weight polysaccharide are added at a range of current density of 50 A/dm$^2$ to 100 A/dm$^2$.

Another method of production of a copper foil for fine pattern printed circuits comprises forming a burnt plating layer at copper on at least one surface of an untreated electrodeposited copper foil having a surface roughness in terms of 10-point average roughness Rz of not more than 2.5 µm and a minimum distance between peaks of rough pyramid of at least 5 µm by electroplating in a plating bath containing at least one of 0.001 to 5 g-Mo/l, 0.01 to 10 g-M/l (M=Fe and/or Co and/or Ni) and 0.1 to 1 ppm W while holding a plating solution temperature of 10 to 30° C., using the untreated electrodeposited copper foil as the cathode, and at a current density near the limit current density of the bath.

Alternatively, it comprises forming a burnt plating layer of copper on at least one surface of an untreated electrodeposited copper foil having a surface roughness in terms of 10-point average roughness Rz of not more than 2.5 µm, a minimum distance between peaks of rough pyramid of at least 5 µm, and crystal grains of an average particle size of not more than 2 µm exposed at the surface, by electroplating in a plating bath containing at least one of 0.001 to 5 g-Mo/l, 0.01 to 10 g-M/l (M=Fe and/or Co and/or Ni) and 0.1 to 1 ppm W while holding a plating solution temperature of 10 to 30° C., using the untreated electrodeposited copper foil as the cathode, and at a current density near the limit current density of the bath.

As the compound having mercapto groups used in the above methods of production, a 3-mercapto-1-propanesulfonate is preferable. A 3-mercapto-1-propanesulfonate is a compound expressed by $HS(CH_2)_3SON_3Na$ etc. and alone does not have that much of an effect of making crystals of the copper finer, but by using it together with another organic compound, it is possible to increase the fineness of the crystals of copper and obtain plating surfaces with smooth surfaces. The molecules of the compound containing mercapto groups react with the copper ions in the copper sulfate electrolytic solution to form a complex or act on the plating interface and raise the overvoltage, whereby the crystals of the copper are made finer and a plating surface with smooth surfaces is formed.

As the high molecular weight polysaccharide used in this embodiment, starch, cellulose, plant gums, or other hydrocarbons forming a colloid in water in general is preferred. As materials inexpensively supplied industrially, edible starch, industrial starch, and dextrin are preferable as starch, water-soluble cellulose ether (sodium carboxymethyl cellulose, carboxymethylhydroxyethyl cellulose ether, etc.) as cellulose, and gum arabic and gum tragacanth as plant gums.

The high molecular weight polysaccharide, in combination with a compound having mercapto groups, finely divides the crystals of copper and forms a plating surface free from rough surfaces. Further, in addition to finely dividing the crystals, it acts to prevent embrittlement of the copper foil produced. The high molecular weight polysaccharide eases the internal stress built up in the copper foil, so not only prevents the phenomenon of tearing or the copper foil balling up when peeling it off from the cathode and coiling it up, but also improves the elongation at room temperature and high temperature.

The low molecular weight glue used in the present embodiment is generally supplied glue or glue obtained by breaking down gelatin by enzymes or acid or alkali to reduce its molecular weight. For example, it is possible to use the glue marketed commercially as "PBF" made by Nippi Gelatin or "PCRA" made by Peter-Cooper Co. of the U.S. The molecular weight of the glue is not more than 10,000. Due to the low molecular weight, the strength of the gel is remarkably low.

Ordinary glue has the effect of preventing microporosity, suppressing roughness of the rough side, and obtaining uniform shapes, but has the problem of causing a drop in the elongation characteristic. However, if using a glue with a smaller molecular weight than that marketed as ordinary glue (or gelatin), there is the effect that the elongation characteristic etc. are not greatly sacrificed, microporosity is prevented, roughness of the rough side is suppressed, and the shapes made uniform. Note that if simultaneously adding high molecular weight polysaccharide and low molecular weight glue to the compound having mercapto groups, the high temperature elongation of the copper foil is improved more than by addition independently, microporosity is prevented, and a fine, uniform smooth surface can be obtained.

Further, chloride ions are added to the electrolytic solution. This is because if there are no chloride ions at all in the electrolytic solution, it is not possible to obtain the desired low profile of the copper foil rough surface. As the amount added, there is an effect with several ppm, but to stably produce a low profile copper foil with a wide range of current densities, holding a range of 10 to 60 ppm is preferable. A low profile is achieved even with an amount of addition over 60 ppm, but no remarkable augmentation in the effect is observed commensurate with the amount of addition. Conversely, if the amount of addition becomes excessive, branch-like deposition occurs or the limit current density drops, so this is not preferred.

As explained above, by jointly adding to the electrolytic solution a compound having mercapto groups, a high molecular weight polysaccharide, a low molecular weight glue, and a small amount of chloride ions, the various properties sought from a low profile copper foil for making fine patterns can be realized at a high level. Further, the surface roughness Rz of the deposited surface of the copper foil produced in this embodiment (hereinafter referred to as the "untreated copper foil") becomes about the same or smaller than the surface roughness Rz of the shiny side of the untreated copper foil, therefore, the surface-treated copper foil obtained by later roughening treating the deposited surface becomes a further low profile compared with the past, and a large etching factor is obtained.

The applicant has already obtained Japanese Patent No. 3313277 for a method of production of an untreated copper foil. However, the method according to the above patent resulted in waviness on the rough surface even if the roughness of the surface was low and was not always suitable for copper foil for fine patterns.

Figure 7:
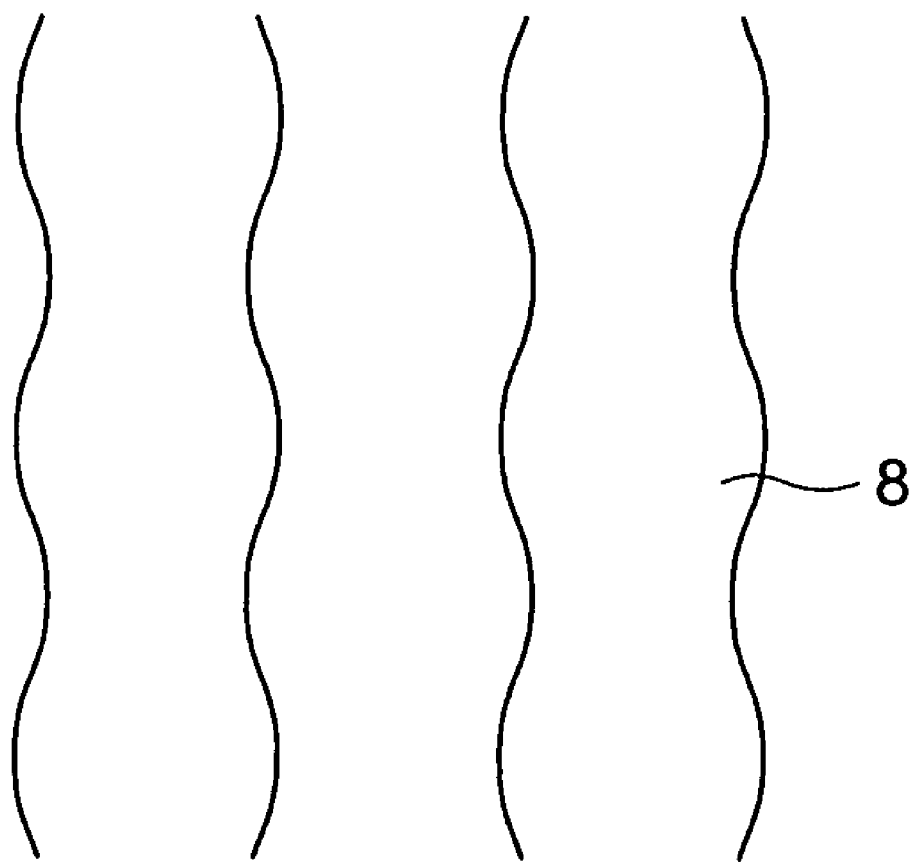
FIG. 7 is a view for explaining nonlinearity due to waviness of copper foil at circuit patterns.

The reason is that if the foil according to this invention is used to try to obtain fine patterns of around 15 μm width, the defect that the linearity of the patterns is not that good becomes clear (see FIG. 7). This poor linearity is believed to be closely related with the waviness of the surface of the copper foil. That is, the parts of the peaks of the waviness become thick with foil, while the parts of the valleys become thin in foil. If using such copper foil to prepare fine patterns, the copper foil at the peak parts will be difficult to etch, while the copper foil corresponding to the valley parts will be easily etched and the linearity becomes poor. Copper foil suitable as copper foil for fine patterns ideally has a low surface roughness, is free from such waviness, and is smooth. A foil with no waviness is optimal.

The inventors pursued surface-treated copper foil free of such waviness and as a result found that an ideal copper foil for fine patterns free from waviness can be obtained by roughening treating untreated copper foil having a surface roughness in terms of 10-point average roughness Rz of not more than 2.5 μm and a minimum distance between peaks of at least 5 μm, found further that untreated copper foil before roughening treating should more preferably be an electrodeposited copper foil having a surface roughness in terms of the 10-point average roughness Rz of not more than 2.5 μm and a minimum distance between peaks of at least 5 μm and having crystal grains of an average particle size of not more than 2 μm exposed at the surface, and thus completed the present invention.

The reason why the surface roughness Rz of the untreated copper foil is made not more than 2.5 μm and the distance between peaks of rough pyramid has to be at least 5 μm is that roughening particles will not concentrate at the portions of the peaks of the surface at the time of electrodeposition of the roughening particles and overall uniform roughening particles will be deposited.

Further, if crystal grains having average particles sizes of not more than 2 μm are exposed at the surface, when further electrodepositing roughening particles over them, the effects of the underlying (ultrathin copper foil) crystal grains will be felt and fine particles can be electrodeposited.

The copper foil according to the present embodiment is extremely excellent in linearity when etching patterns of ultrafine widths. The reason is that the untreated copper foil has no waviness, so there is little fluctuation in the thickness of the foil and the copper grains deposited on the untreated copper foil are small and even in particle size. Therefore, there is little variation in etching of the copper foil when etching the patterns of the ultrafine width.

The method of production of an untreated copper foil serving as the basis for obtaining the surface-treated copper foil of the present embodiment produces an electrodeposited copper foil by a copper electrolytic solution containing a compound having mercapto groups, chloride ions, and, as necessary, a low molecular weight glue and high molecular weight polysaccharide at a range of current density at the time of foil-making of 50 A/dm$^2$ to 100 A/dm$^2$.

Here, if the current density falls below 50 A/dm$^2$, the waviness will become noticeable and the distance between peaks of the waviness will become shorter. The higher the current density, the less the waviness, but if excessively raising the current density, the supply of copper in solution to the titanium drum surface at the time of foil-making will become insufficient, the limit current density will be exceeded, and burnt plating will result or powdery plating will result. In practice, about 100 A/dm$^2$ is the limit. Further, to reduce the waviness at such a current density, the flow rate of the plating solution is an important factor. The flow rate of the plating solution is preferably 0.05/min to 5 m/min, more preferably 0.2 m/min to 2 m/min. This is because if less than 0.05 m/min, the waviness will become noticeable, while over 5 m/min is difficult in terms of the structure of the facilities and is not practical.

As the method of roughening treating the surface of an untreated copper foil, it is possible to electroplate at least one surface of the untreated copper foil in a copper plating bath containing at least one of molybdenum, iron, cobalt, nickel, and tungsten at a plating solution temperature held to 10 to 30° C. using the untreated copper foil as a cathode at a current density near the limit current density of the bath so as to cause copper alloy particles to deposit as the burnt plating layer of the copper in the shape of a plurality of projections. Further, it is possible to cover the burnt plating layer by a thin plating layer of copper to prevent the plurality of projections from dropping off. It is known to add to the burnt plating electrolytic solution of the roughening at least one of selenium, tellurium, arsenic, antimony, and bismuth in an amount of 0.01 to 1 g-M/l (M=Se, Te, As, Sb, or Bi) (see Japanese Examined Patent Publication (Kokoku) No. 53-39327).

However, even if using this electrolytic solution for burnt plating the untreated copper foil according to the present embodiment, the bond strength with a resin substrate is not sufficient. Further, when not using these additives, the bond strength becomes relatively good, but abnormal deposition occurs.

Further, the applicant previously discovered a method of burnt plating ordinary untreated copper foil (foil with tough surfaces) using a copper plating bath containing at least one of molybdenum, iron, cobalt, nickel, and tungsten (see Japanese Unexamined Patent Publication (Kokai) No. 11-256389). However, even if using this plating solution, roughening treating suitable for fine patterns cannot be obtained unless using the untreated copper foil shown in this application for the untreated copper foil and making the plating solution temperature 10 to 30° C.

It is only by setting this temperature range that roughening treating is possible with roughening particles small in size and even in size and free of abnormal deposition.

The apparent thickness of the burnt plating layer provided on the untreated copper foil according to the present embodiment is preferably 0.2 to 2.5 µm, more preferably 0.4 to 1.5 µm. Here, "apparent thickness" is the thickness found by converting the granular plating layer deposited when passing a "burnt plating" current to flat plating.

The copper foil of the present embodiment may have a copper plating layer (so-called "encapsulation layer") formed on the burnt plating layer. The apparent thickness of the encapsulation layer is preferably 0.2 to 2.5 µm, more preferably 0.4 to 1.5 µm.

Note that the copper foil according to the present embodiment may also, as desired, have further formed over the burnt plating layer or encapsulation layer one or more layers of a nickel plating layer, a nickel alloy plating layer, a zinc plating layer, a zinc alloy plating layer, a cobalt plating layer, a cobalt alloy plating layer, a chrome plating layer, and a chrome alloy plating layer. Further, the encapsulation layer or the nickel plating layer etc. may further be treated by a coupling agent. By forming at least one plating layer of nickel, zinc, cobalt, chrome, or an alloy thereof on the surface of the copper foil according to the present embodiment as desired, it is possible to obtain a surface-treated copper foil suitable for a fine pattern printed circuit having the desired performance.

On the other hand, in the present embodiment, the method of forming the burnt plated layer on the surface of the copper foil is to use an acidic copper electroplating bath and perform electrolysis using the untreated copper foil as a cathode at a current density near the limit current density of the electroplating bath. The electrolytic solution of the electroplating bath should contain at least one of molybdenum, iron, cobalt, nickel, and tungsten.

Here, the concentration of the molybdenum is preferably 0.001 to 5 g-Mo/l. If the concentration of molybdenum is less than 0.001 g-Mo/l, the effect is not remarkable, while even if added in an amount over 5 g-Mo/l, the effect will not increase remarkably proportional to the increase in the presence, so this would not be economical. Further, the burnt plating layer would easily powderize, so this is not preferred.

Iron, cobalt, and nickel are preferably contained in amounts of 0.1 to 10 g-M/l (M being Fe, Co, and Ni). Tungsten is preferably included in an amount of 0.1 ppm to 1 ppm. The behavior of the iron etc. outside of the prescribed concentrations is similar to that of molybdenum.

Note that the additives are not particularly limited so long as they can be dissolved in the electrolytic solution, but typical compounds are given below:

1. Molybdenum: Sodium molybdate (2-hydrate)
2. Iron: Ferrous sulfate (7-hydrate)
3. Cobalt: Cobalt sulfate (7-hydrate)
4. Nickel: Nickel sulfate (7-hydrate)
5. Tungsten: Sodium tungstenate (2-hydrate)

As the acidic copper electroplating bath, it is possible to use any mineral acid, but usually it is preferable to use a sulfuric acid bath (containing copper sulfate as copper). As an example, illustrating the solution conditions of the acidic copper electroplating bath:

1. Copper: 5 to 50 g-Cu/l
2. Molybdenum: 0.01 to 5 g-Mo/l
3. Others: at least one of 0.01 to 10 g-M/l (M being Fe, Co, or Ni) or 0.1 ppm to 1 ppm W
4. Acid: 10 to 200 g-$H_2SO_4$/l
5. Solution temperature: 10 to 30° C.

In the method of production of a copper foil according to the present embodiment, after the step of forming the burnt plating layer, it is also possible to provide a plating layer of copper over that burnt plating layer. Further, in the method of production of a copper foil according to the present embodiment, after the step of forming the burnt plating layer, it is also possible to provide a step of forming over the burnt plating layer a plating layer of a nickel or nickel alloy plating layer, a zinc or zinc alloy plating layer, a cobalt or cobalt alloy plating layer, or a chrome or chrome alloy plating layer.

Further, after the step of forming the plating layer of copper, it is also possible to add a step of forming at least one layer of a nickel plating layer, nickel alloy plating layer, zinc plating layer, zinc alloy plating layer, cobalt plating layer, cobalt alloy plating layer, chrome plating layer, and chrome alloy plating layer. Further, after the step of forming the plating layer of copper or the plating layer of nickel, zinc, cobalt, chrome, or their alloys, it is also possible to provide a chromate treatment or silane coupling agent treatment step. The conditions of these steps may be set according to the known methods.

(1) Production of Untreated Copper Foil

A. Examples 1 to 4

Additives of the compositions shown in Table 1 were added to an acidic copper electroplating bath of 70 to 130 g/l of copper and 80 to 140 g/l of sulfuric acid. In the table, MPS indicates sodium 3-mercaptopropane sulfonate, HEC (high molecular weight polysaccharide) indicates hydroxyethylcellulose, and the glue is a low molecular weight glue of a molecular weight of 3,000. The MPS, HEC (high molecular weight polysaccharide), glue, and chloride ions were added to give the concentrations shown in Table 1 and prepare foil-making electrolytic solutions. Note that the concentration of chloride ions was made 30 ppm in all cases, but the concentration of chloride ions is not limited to this. The prepared electrolytic solution was then used to produce untreated copper foil of a thickness of 12 µm using a precious metal oxide-covered titanium electrode as the anode and a titanium rotary drum as the cathode under the electrolytic conditions shown in Table 1.

B. Comparative Examples 1 to 4

Additives of the compositions shown in Table 1 (using as glue a glue of a molecular weight of 60,000) were added to an acidic copper electroplating bath of 70 to 130 g/l of copper and 80 to 140 g/l of sulfuric acid and the same method of production as in the examples was used to produce untreated copper foils of the comparative example.

The surface roughnesses Rz and Ra of the untreated copper foils produced by the examples and comparative examples were measured using a surface roughness meter (Model SE-3C made by Kosaka Kenkyusho) (here, the surface roughnesses Rz and Ra being Rz and Ra defined in JIS-B0601-1994 "Definitions and Indications of Surface Roughness"). The elongations in the width direction at room temperature and after holding at a temperature of 180° C. for 5 minutes and the tensile strengths at those temperatures were measured using a tensile tester (Model 1122 made by Instron). The results are shown in Table 2.

TABLE 1

Electrolytic Solution Composition and Electrolysis Conditions

| | Additives (ppm) | | | | | Electrolysis conditions | |
|---|---|---|---|---|---|---|---|
| | MPS | HEC | Glue | Thiourea | Chlorine | Current density (A/dm$^2$) | Solution temperature (° C.) |
| Ex. 1 | 1.5 | 10.0 | 0 | | 30 | 70 | 58 |
| Ex. 2 | 0.5 | 0 | 3.0 | | 30 | 70 | 58 |
| Ex. 3 | 0.8 | 3.0 | 6.0 | | 30 | 70 | 58 |
| Ex. 4 | 1.0 | 5.0 | 5.0 | | 30 | 70 | 58 |
| Comp. Ex. 1 | | | 1.5 | 0.4 | 30 | 50 | 58 |
| Comp. Ex. 2 | | | 4.0 | | 30 | 50 | 58 |
| Comp. Ex. 3 | | | 4.0 | | 30 | 50 | 58 |
| Comp. Ex. 4 | 0.8 | 3.0 | 6.0 | | 30 | 50 | 58 |

Notes:
The electrolytic solution was a copper sulfate/sulfuric acid solution. The concentration was 70 to 130 g/liter of copper and 80 to 140 g/liter of sulfuric acid.
MPS: Sodium 3-mercaptopropane sulfonate
HEC: Hydroxyethylcellulose
Glue: For Examples 2 to 4, low molecular weight glue (molecular weight about 3,000) For Comparative Examples 1 and 2, ordinary glue (molecular weight about 60,000)
Copper plating solution flow rate for examples: 0.3 m/sec
Copper plating solution flow rate for comparative examples: 0.1 m/sec

TABLE 2

Surface Roughness and Mechanical Properties of Untreated Copper Foil

| | Surface roughness (μm) | | Shiny side roughness (μm) | | room temperature | | High temperature (180° C.) | | Copper plating crystal shape | Average distance between peaks (μm) | Average particle size of crystal grains (μm) |
|---|---|---|---|---|---|---|---|---|---|---|---|
| | Rz | Ra | Rz | Ra | Tensile strength (kN/cm) | Elongation (%) | Tensile strength (kN/cm) | Elongation (%) | | | |
| Ex. 1 | 1.3 | 0.30 | 2.0 | 0.40 | 37.2 | 18.1 | 18.6 | 26.7 | Granular | 10 | 1.5 |
| Ex. 2 | 2.1 | 0.32 | 2.1 | 0.35 | 33.6 | 11.7 | 19.5 | 19.7 | Granular | 10 | 1.5 |
| Ex. 3 | 1.1 | 0.20 | 1.8 | 0.35 | 35.3 | 19.8 | 19.0 | 24.6 | Granular | 12 | 1.4 |
| Ex. 4 | 0.6 | 0.14 | 1.4 | 0.23 | 33.8 | 14.4 | 18.7 | 25.8 | Granular | 15 | 1.2 |
| Comp. Ex. 1 | 3.3 | 0.40 | 2.0 | 0.37 | 36.8 | 9.0 | 20.3 | 8.0 | Granular | 4.5 | 1.5 |
| Comp. Ex. 2 | 4.8 | 0.70 | 2.1 | 0.32 | 33.7 | 9.5 | 20.5 | 2.0 | Columnar | 4.5 | >2.0 |
| Comp. Ex. 3 | 4.8 | 0.70 | 2.1 | 0.32 | 33.7 | 9.5 | 20.5 | 2.0 | Columnar | 4.5 | >2.0 |
| Comp. Ex. 4 | 1.2 | 0.20 | 1.9 | 0.35 | 33.9 | 17.5 | 19.1 | 23.4 | Granular | 4.5 | 1.5 |

As clear from Table 2, the roughnesses Rz of the rough sides of the untreated copper foils were low and the wavinesses small.

(2) Formation of Burnt Plating Layer

The untreated copper foils produced in Examples 1 to 4 and Comparative Examples 1 to 4 were treated by cathodic electrolysis by direct current by the roughening treating solution compositions of Table 3 and the burnt plating conditions of Table 4 to cause burnt plating layers comprised of pluralities of fine projections to deposit on the rough sides of the untreated copper foils.

TABLE 3

Burnt Plating Solution Composition

| | Cu (g/l) | Sulfuric acid (g/l) | Mo (g/l) | Ni (g/l) | Fe (g/l) | W (ppm) | Co (g/l) | As (ppm) | Solution temp. (° C.) |
|---|---|---|---|---|---|---|---|---|---|
| Ex. A | 20–35 | 110–160 | 0.35 | | 4.0 | 0.2 | | | 15 |
| Ex. B | 20–35 | 110–160 | 0.05 | | 8.0 | 0.4 | | | 15 |
| Ex. C | 20–35 | 110–160 | 0.25 | 2.0 | | | | | 15 |
| Ex. D | 20–35 | 110–160 | 0.25 | | | | 2.0 | | 15 |
| Ex. E | 20–35 | 110–160 | 0.35 | | 4.0 | | | | 15 |
| Ex. F | 20–35 | 110–160 | | | | 0.8 | | | 15 |
| Ex. G | 20–35 | 110–160 | | | 4.0 | | | | 15 |
| Comp. Ex. H | 20–35 | 110–160 | | | | | | 350 | 30 |

TABLE 4

Conditions of Burnt Plating

| | Current density | Treatment time |
|---|---|---|
| Burnt plating | 10 to 50 A/dm² | 2 to 15 sec |

In the examples of the invention, burnt plating was performed twice under the specified plating conditions, but the burnt plating may also be performed once or three or more times.

(3) Formation of Encapsulation Plating

The surface treated copper foils formed with the plurality of projections on their rough sides were treated by cathodic electrolysis by direct current under the conditions of Table 5 to cover the plurality of fine projections with a thin layer of copper.

TABLE 5

Conditions of Encapsultion Plating

| Copper | Sulfuric acid | Solution temperature | Current density | Treatment time |
|---|---|---|---|---|
| 50–80 g/l | 90–130 g/l | 50° C. | 10 to 30 A/dm² | 2 to 15 sec |

In the examples, the burnt plating and the encapsulation plating were performed twice each under the specified plating conditions, but the burnt plating and the encapsulation plating may also be performed once or three or more types.

(5) Measurement of Performance

The peel strengths with an FR-4 substrate of foils roughening treated under the same conditions in the roughening solution of Table 3 using untreated copper foils prepared by the method of Example 1 of Table 1 are shown in Table 6.

TABLE 6

Bond Strength with FR-4

| Foil type | Original foil Rz | Rz after roughening Treating | FR-4 peel strength (kN/m) |
|---|---|---|---|
| Ex. A, electrolysis | 1.3 | 1.9 | 1.00 |
| Ex. B, electrolysis | 1.3 | 1.7 | 0.96 |
| Ex. C, electrolysis | 1.3 | 1.9 | 1.02 |
| Ex. D, electrolysis | 1.3 | 2.2 | 0.97 |
| Ex. E, electrolysis | 1.3 | 2.2 | 1.10 |
| Ex. F, electrolysis | 1.3 | 2.2 | 1.06 |
| Ex. G, electrolysis | 1.3 | 2.4 | 1.11 |
| Comp. Ex. H, electrolysis | 1.3 | 2.3 | 0.65 |

The peel strengths of the copper foils were measured for 10 mm widths after laminating the copper foils to FR-4 substrates. Copper foils having lower roughnesses and higher peel strengths than the comparative examples were obtained in the examples of the invention. However, as explained above, in the finer patterns of copper foils in recent years, the properties sought from the copper foils have become more diversified. For example, it is required that there be no abnormal deposition, there be no local peeling of lines, the etchability be superior, and the linearity be superior. Copper foils of the examples and comparative examples were evaluated for these items. The results of evaluation of foils obtained by roughening treating the untreated copper foils prepared in Examples 1 to 4 and Comparative Examples 1 to 4 by the roughening solutions of Example A and Comparative Example H are shown in Tables 7 and 8.

TABLE 7

Results of Evaluation of Peeling From Resin Substrate and Etchability

| Untreated copper foil | Roughening solution | Original foil Rz (μm) | Rz after roughening treating (μm) | Abnormal deposition | Peel strength (kN/m) | Tape peeling test | Etchability (L/S: μm) | Pattern linearity |
|---|---|---|---|---|---|---|---|---|
| Ex. 1 | Ex. A | 1.3 | 1.9 | None | 1.00 | No peeling | 15/15 | Good |
| Ex. 2 | Ex. A | 2.1 | 2.9 | None | 1.10 | No peeling | 25/25 | Good |
| Ex. 3 | Ex. A | 1.1 | 1.9 | None | 1.01 | No peeling | 15/15 | Good |
| Ex. 4 | Ex. A | 0.6 | 1.4 | None | 0.92 | No peeling | 10/10 | Good |
| Comp. Ex. 1 | Ex. A | 2.1 | 3.0 | None | 1.21 | Local peeling | 30/30 | Poor |
| Comp. Ex. 2 | Ex. A | 4.8 | 5.7 | None | 1.24 | No peeling | 75/75 | Poor |
| Comp. Ex. 3 | Ex. A | 2.0 | 2.9 | Yes | 1.10 | No peeling | 25/25 | Good |
| Comp. Ex. 4 | Ex. A | 1.3 | 2.1 | None | 1.02 | No peeling | 15/15 | Poor |

TABLE 8

Results of Evaluation of Peeling From Resin Substrate and Etchability

| Untreated copper foil | Roughening solution | Original foil Rz (μm) | Rz after roughening treating (μm) | Abnormal deposition | Peel Strength (kN/m) | Tape peeling test | Etchability (L/S: μm) | Pattern linearity |
|---|---|---|---|---|---|---|---|---|
| Ex. 1 | Comp. Ex. H | 1.3 | 2.3 | None | 0.65 | Local peeling | 15/15 | Good |
| Ex. 2 | Comp. Ex. H | 2.1 | 2.7 | None | 0.75 | Local peeling | 25/25 | Good |
| Ex. 3 | Comp. Ex. H | 1.1 | 1.5 | None | 0.65 | Local peeling | 15/15 | Good |
| Ex. 4 | Comp. Ex. H | 0.6 | 1.1 | None | 0.60 | Local peeling | 10/10 | Good |
| Comp. Ex. 1 | Comp. Ex. H | 2.1 | 3.0 | None | 0.85 | Local peeling | 30/30 | Poor |
| Comp. Ex. 2 | Comp. Ex. H | 4.8 | 5.4 | None | 1.25 | — | 75/75 | Poor |
| Comp. Ex. 3 | Comp. Ex. H | 2.0 | 2.6 | Yes | 0.80 | Local peeling | 25/25 | Good |
| Comp. Ex. 4 | Comp. Ex. H | 1.3 | 1.9 | None | 0.65 | Local peeling | 20/20 | Poor |

Measurement of Peel Strength

The peel strengths of the copper foils were measured. The measurements were made for 10 mm widths after laminating the copper foils to FR-4 substrates. In Examples 1 to 4 and Comparative Examples 1 and 2, the comparative examples rather had larger peel strengths. The reason the comparative examples had larger peel strengths was that the surfaces of the copper foils before roughening treating had peaks and valleys (rough surfaces), so the roughening particles were deposited concentrated at the peak parts and almost no roughening particles were deposited at the valley parts, but since the measurement is conducted for wide widths of 10 mm, the peel strength becomes larger due to the anchor effect of the roughening particles. Note that Comparative Example 3 shows roughening treating of the shiny side of the copper foil, so there are no relief peaks and valleys (rough surfaces) on the surface like in the examples of the present invention and the peel strength itself becomes the same extent as in the examples. However, in the case of this copper foil, there is the critical defect that abnormal deposition cannot be avoided. Further, as will be understood from a comparison of the results of Table 8 where burnt plating was performed using the conventional roughening solution with the values of Table 7 where burnt plating was performed using the roughening solution of the present invention, when burnt plating untreated copper foils having flat surfaces, use of the plating bath of the present invention gives a stronger peel strength. This is because while the values of the Rz itself are not that different, burnt plating according to the present invention gives grain shapes closer to spherical shapes (the conventional burnt plating gives flat shapes). However, when the widths become very fine ones of less than 30 μm, the peel strengths of the foils with peaks and valleys (rough surfaces) fall as explained below.

Measurement of Peel Strength

The peel strengths of the copper foils prepared in the above comparative examples fell when the widths became ultrafine ones such as less than 30 μm. The reason is that as the line widths become finer, the amounts of deposition of roughening particles on the line widths become sparse. To confirm this phenomenon, a tape peeling test was conducted using printed circuit boards prepared by surface-treated copper foils of the examples and copper foils of the comparative examples of line/space ratios of 30 μm/30 μm. The results are shown together in Tables 7 and 8. Note that the tape peeling test (using tape of a tape adhesive power of 0.80 kN/m) evaluated whether patterns peeled off from the resin substrates when adhesive tape was applied to L/S=30/30 test patterns and then peeled off. As shown in Table 7, when the lines become ultrafine widths such as with a line/space ratio of 30/30 μm, the copper foil circuits of the comparative examples peeled off more easily than the ultrathin copper foils of the examples of the present invention. Note that in Table 8, the shapes of the roughening treated side differ from the examples of the present invention. The shapes of the granules of the roughening treated side became flat, the peel strength of a 10 mm width was low, and peeling end up occurring even with a line/space ratio of 30/30 μm. It is only with the combination of the untreated copper foil and the roughening treating as in the present invention that a good bondability and fine patterning can be achieved.

Evaluation of Etchability

The copper foils were laminated to FR-4 substrates, then the surfaces of the copper foils were printed with test patterns of line/space ratios of 10/10 μm, 15/15 μm, 20/20 μm, 25/25 μm, 30/30 μm, 35/35 μm, 40/40 μm, 45/45 μm, 50/50 μm (line lengths of 30 mm, 10 lines) and etched by an etching solution of copper chloride. The line widths when etching was possible without bridging of the lines are shown in Tables 7 and 8 as numerical values. With the surface-treated copper foils prepared in the examples of the invention, etching as possible down to 15 μm, while with copper foils prepared in the comparative examples, 25 μm was the lowest.

Note that the patterns prepared above were observed for linearity of the patterns under a 100× specimen microscope. Tables 7 and 8 show the linearities of the patterns. Superior linearities are indicated as "good", while waviness in patterns such as in FIG. 7 are indicated as "poor". Examples 1 to 4 of copper foils produced by high current densities according to the present inventions were free of pattern waviness and superior in linearity compared with Comparative Example 4 of copper foil produced by the conventional low current density. The point of superior linearity becomes an important factor the finer the patterns. If the pattern waviness becomes worse, it will lead to short-circuits of adjoining patterns.

As explained above, the present invention enables etching down to the ultrafine width of lines and spaces of 15 μm. Even after etching lines of 15 μm, large number of roughening particles are deposited on the 15 μm lines, so regardless of the fact that the roughness is low, the fine lines and circuit board have a high bond strength and the patterns are superior in linearity, so the surface-treated copper foil of the present invention enables provision of printed circuit boards of superfine patterns and multilayer printed circuit boards of superfine patterns.

Summarizing the effects of the invention, by using the surface-treated copper foil of the present invention, it is possible to provide a copper foil having an extremely small surface roughness enabling application to fine pattern circuits and having a high bond strength. Further, according to the present invention, it is possible to provide a copper foil sufficiently satisfying the predetermined performance as copper foil for fine pattern printed circuits and friendly to the environment and a method of production of the same.

The present invention provides a copper foil for fine pattern printed circuits having sufficient bond strength with resin substrates, meeting the requirements for fine patterning of recent years when electronic equipment has been made smaller and higher in performance and when printed circuits are being required to be made smaller and higher in density, free from the problems of residual copper and erosion at the bottom portion of the circuit lines at the time of formation of fine patterns, and superior in both heat resistance and electrical properties and provides a superior method of production of that copper foil.

While the invention has been described with reference to a specific embodiment chosen for purpose of illustration, it should be apparent that numerous modifications could be made thereto by those skilled in the art without departing from the basic concept and scope of the invention.

What is claimed is:

1. A copper foil for fine pattern printed circuits comprising untreated copper foil roughening treated on its surface,
   wherein said untreated copper foil before roughening treatment is an electrodeposited copper foil having a surface roughness in terms of 10-point average roughness Rz of not more than 2.5 μm and a minimum distance between peaks of rough pyramid of at least 5 μm, and
   at least one surface of said untreated copper foil is roughening treated by being formed with a burnt plating layer by burnt plating of copper containing at least one of molybdenum, iron, cobalt, nickel and tungsten.

2. A copper foil for fine pattern printed circuits as set forth in claim 1, wherein said burnt plating layer is formed over it with a copper plating layer.

3. A copper foil for fine pattern printed circuits as set forth in claim 2, wherein said burnt plating layer or said copper plating layer is provided over it with at least one layer of a nickel plating layer, nickel alloy plating layer, zinc plating layer, zinc alloy plating layer, cobalt plating layer, cobalt alloy plating layer, chrome plating layer, and chrome alloy plating layer and is optionally provided over that with a layer formed by treatment by chromate or a silane coupling agent.

4. A copper foil for fine pattern printed circuits as set forth in claim 1, wherein said burnt plating layer is provided over it with at least one layer of a nickel plating layer, nickel alloy plating layer, zinc plating layer, zinc alloy plating layer, cobalt plating layer, cobalt alloy plating layer, chrome plating layer, and chrome alloy plating layer and is optionally provided over that with a layer formed by treatment by chromate or a silane coupling agent.

5. A copper foil for fine pattern printed circuits comprising untreated copper foil roughening treated on its surface,
   wherein said untreated copper foil before roughening treatment is an electrodeposited copper foil having a surface roughness in terms of 10-point average roughness Rz of not more than 2.5 μm, a minimum distance between peaks of rough pyramid of at least 5 μm, and crystal grains of an average particle size of not more than 2 μm exposed at the surface, and
   at least one surface of said untreated copper foil is roughening treated by being formed with a burnt plating layer by burnt plating of copper containing at least one of molybdenum, iron, cobalt, nickel and tungsten.

6. A copper foil for fine pattern printed circuits as set forth in claim 5, wherein said burnt plating layer is formed over it with a copper plating layer.

7. A copper foil for fine pattern printed circuits as set forth in claim 6, wherein said burnt plating layer or said copper plating layer is provided over it with at least one layer of a nickel plating layer, nickel alloy plating layer, zinc plating layer, zinc alloy plating layer, cobalt plating layer, cobalt alloy plating layer, chrome plating layer, and chrome alloy plating layer and is optionally provided over that with a layer formed by treatment by chromate or a silane coupling agent.

8. A copper foil for fine pattern printed circuits as set forth in claim 5, wherein said burnt plating layer is provided over it with at least one layer of a nickel plating layer, nickel alloy plating layer, zinc plating layer, zinc alloy plating layer, cobalt plating layer, cobalt alloy plating layer, chrome plating layer, and chrome alloy plating layer and is optionally provided over that with a layer formed by treatment by chromate or a silane coupling agent.

* * * * *